(12) United States Patent
Kim et al.

(10) Patent No.: US 8,253,228 B2
(45) Date of Patent: Aug. 28, 2012

(54) PACKAGE ON PACKAGE STRUCTURE

(75) Inventors: Yong-Hoon Kim, Suwon-si (KR);
Byeong-Yeon Cho, Suwon-si (KR);
Hee-Seok Lee, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/045,103

(22) Filed: Mar. 10, 2011

(65) Prior Publication Data

US 2011/0241168 A1    Oct. 6, 2011

(30) Foreign Application Priority Data

Mar. 31, 2010 (KR) .................. 10-2010-0029412

(51) Int. Cl.
*H01L 23/02* (2006.01)
(52) U.S. Cl. .............. 257/685; 257/686; 257/861
(58) Field of Classification Search .............. 257/686, 257/685, 891, E23.021
See application file for complete search history.

(56) References Cited

U.S. PATENT DOCUMENTS

| 7,242,081 | B1 | 7/2007 | Lee |
| 7,279,795 | B2 | 10/2007 | Periaman et al. |
| 2006/0208348 | A1* | 9/2006 | Ohsaka et al. ............. 257/685 |

FOREIGN PATENT DOCUMENTS

JP    2006-344789    12/2006

* cited by examiner

*Primary Examiner* — Howard Weiss
*Assistant Examiner* — Steven Rao
(74) *Attorney, Agent, or Firm* — F. Chau & Associates, LLC

(57) ABSTRACT

A package on package structure includes a lower package and an upper package. The lower package includes a first semiconductor chip disposed in a chip region of an upper surface of a first substrate. The upper package includes a second semiconductor chip disposed on an upper surface of a second substrate, and a decoupling capacitor disposed in an outer region of a lower surface of the second substrate. The lower surface of the second substrate opposes the upper surface of the second substrate and faces the upper surface of the first substrate. The plane area of the second substrate is larger than the plane area of the first substrate. The outer region of the lower surface of the second substrate extends beyond a periphery of the first substrate.

20 Claims, 4 Drawing Sheets

PACKAGE ON PACKAGE STRUCTURE

CROSS-REFERENCE TO RELATED APPLICATION

This application claims priority under 35 U.S.C. §119 to Korean Patent Application No. 10-2010-0029412 filed on Mar. 31, 2010, the disclosure of which is incorporated by reference herein in its entirety.

BACKGROUND

1. Technical Field

The present disclosure relates to a package on package (POP) structure, and more particularly, to a (POP) structure formed by vertically laminating one or more semiconductor packages.

2. Discussion of the Related Art

A system in package (SIP) includes several semiconductor packages integrated into a single semiconductor package, resulting in a multifunctional semiconductor package having a high capacity and a reduced size.

A SIP may be formed using different structures. For example, a SIP may be a multi-chip package (MCP) structure or a package on package (POP) structure. An MCP structure includes several semiconductor chips formed and laminated within one semiconductor package. A POP structure includes several semiconductor packages, which are separately assembled and electrically inspected, and vertically laminated on one another.

A semiconductor chip in a semiconductor package receives a predetermined voltage from an external power supply. Decoupling capacitors may be utilized to prevent the occurrence of voltage flicker or a voltage drop phenomenon when the predetermined voltage is supplied to the semiconductor chip. The decoupling capacitors may be disposed within the semiconductor chip, in a semiconductor package, or in a motherboard to which the semiconductor package is connected. Since the decoupling capacitors may be more effective when they are in close proximity to the semiconductor chip, the decoupling capacitors are often disposed within the semiconductor chip.

However, if the capacitance of the decoupling capacitors is not high enough, the voltage flicker or voltage drop phenomenon may not be effectively prevented. Thus, the capacitance of the decoupling capacitors is maintained over a predetermined level. The capacitance of the decoupling capacitors is directly related to the size of the decoupling capacitors. Thus, when the decoupling capacitors are disposed within the semiconductor chip, the capacitance of the decoupling capacitors is limited by the size of the semiconductor chip.

In order to utilize decoupling capacitors having a capacitance that is not limited by the size of the semiconductor chip, the decoupling capacitors may be disposed in the semiconductor package rather than within the semiconductor chip. However, when the semiconductor package is a POP structure, increasing the size of the decoupling capacitors may result in difficulty laminating the packages. Therefore, the size of the decoupling capacitors may also be limited when using a POP structure.

SUMMARY

According to an exemplary embodiment of the present inventive concept, a package on package structure includes a lower package and an upper package. The lower package includes a first semiconductor chip disposed in a chip region of an upper surface of a first substrate. The upper package includes a second semiconductor chip disposed on an upper surface of a second substrate, and a decoupling capacitor disposed in an outer region of a lower surface of the second substrate. The lower surface of the second substrate opposes the upper surface of the second substrate and faces the upper surface of the first substrate, a plane area of the second substrate is larger than a plane area of the first substrate, and the outer region of the lower surface of the second substrate extends beyond a periphery of the first substrate.

According to an exemplary embodiment of the present inventive concept, a package on package structure includes a lower package and an upper package. The lower package includes a first semiconductor chip disposed in a chip region of an upper surface of a first substrate, and a plurality of lower package connection pads disposed in a neighboring region of the upper surface of the first substrate. The neighboring region is adjacent to the chip region. The upper package includes a second semiconductor chip disposed on an upper surface of a second substrate, a plurality of upper package connection pads disposed on a lower surface of the second substrate and substantially aligned with the lower package connection pads, and a decoupling capacitor disposed in an outer region of the lower surface of the second substrate. The outer region extends beyond a periphery of the first substrate. The lower surface of the second substrate opposes the upper surface of the second substrate and faces the upper surface of the first substrate, and connection bumps electrically connect the lower package connection pads and the upper package connection pads.

According to an exemplary embodiment of the present inventive concept, a package on package structure includes a lower package and an upper package. The lower package includes a first semiconductor chip disposed in a chip region of an upper surface of a first substrate, a plurality of lower package connection pads disposed in a neighboring region of the upper surface of the first substrate, and an encapsulant material disposed on the upper surface of the first substrate. The neighboring region is adjacent to the chip region. The upper package includes a second semiconductor chip disposed on an upper surface of a second substrate, a plurality of upper package connection pads disposed on a lower surface of the second substrate and substantially aligned with the lower package connection pads, and a decoupling capacitor disposed in an outer region of the lower surface of the second substrate. The outer region extends beyond a periphery of the first substrate. The lower surface of the second substrate opposes the upper surface of the second substrate and faces the upper surface of the first substrate, and electrical connection members penetrate the encapsulant material and electrically connect the lower package connection pads and the upper package connection pads.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF EXEMPLARY EMBODIMENTS

Figure 1:
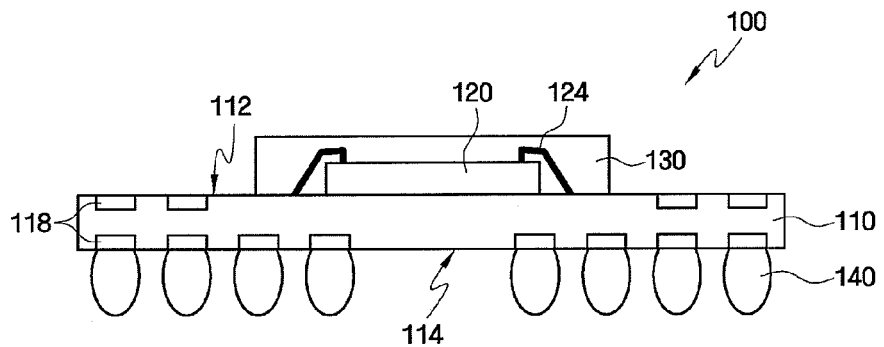
FIG. 1 is a sectional view of a lower package according to an exemplary embodiment of the present inventive concept.

Exemplary embodiments of the present inventive concept will be described more fully hereinafter with reference to the accompanying drawings. Like reference numerals refer to like elements throughout the accompanying drawings.

Figure 2:
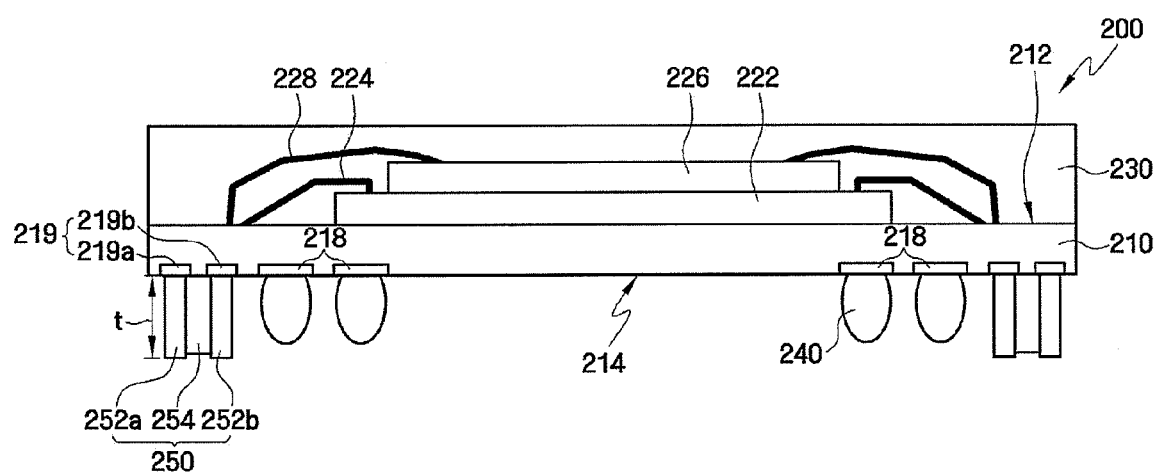
FIG. 2 is a sectional view of an upper package according to an exemplary embodiment of the present inventive concept.
Figure 3:
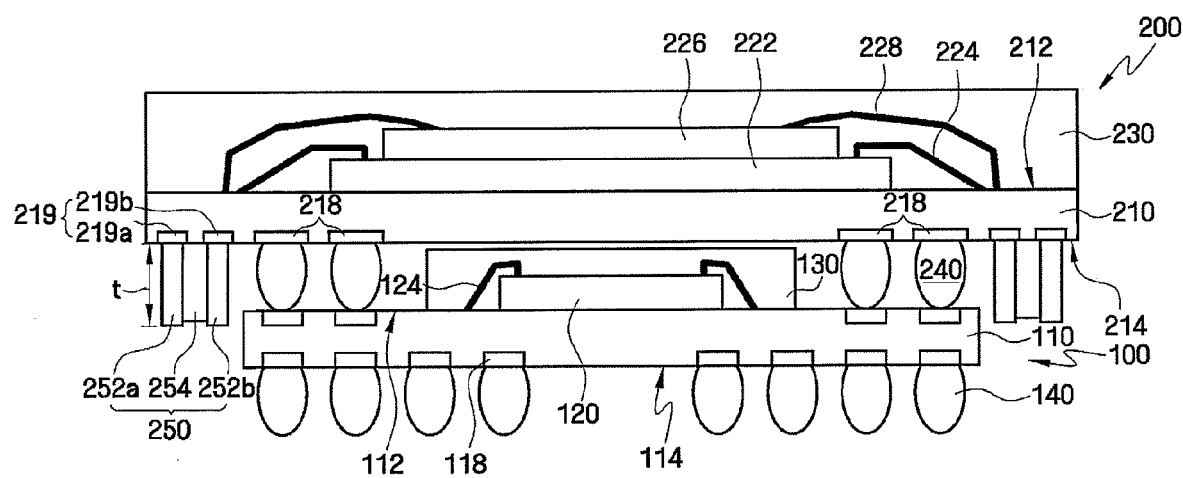
FIG. 3 is a sectional view of a package on package structure in which the lower package of FIG. 1 and the upper package of FIG. 2 are laminated.
Figure 4:
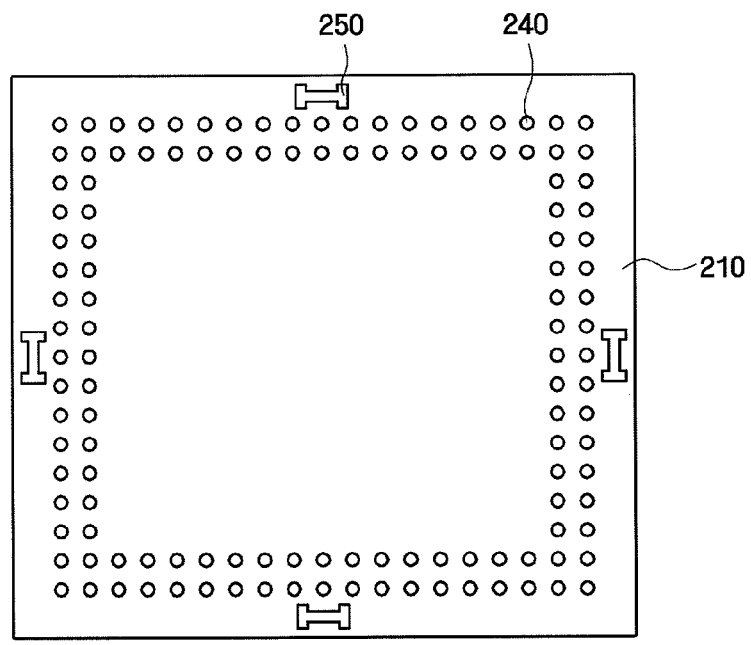
FIG. 4 is a plan view of a lower surface of the upper package of FIG. 2.

Hereinafter, with reference to FIGS. 1 to 4, a package on package (POP) structure according to an exemplary embodiment of the present inventive concept will be described. FIG. 1 is a sectional view of a lower package according to an exemplary embodiment of the present inventive concept. FIG. 2 is a sectional view of an upper package according to an exemplary embodiment of the present inventive concept. FIG. 3 is a sectional view of a package on package structure in which the lower package of FIG. 1 and the upper package of FIG. 2 are laminated. FIG. 4 is a plan view of a lower surface of the upper package of FIG. 2 according to an exemplary embodiment of the present inventive concept.

Referring to FIG. 1, a lower package 100 includes a substrate 110, a semiconductor chip 120, an encapsulant material 130, and a plurality of connection bumps 140.

The substrate 110 includes an upper surface 112 and an opposing lower surface 114. The substrate 110 may be, for example, a printed circuit board (PCB). A chip region and neighboring regions are defined on the upper surface 112 of the substrate 110. The semiconductor chip 120 is attached to the substrate 110 at the chip region, and the neighboring regions, which are disposed adjacent to the chip region, are used as connection regions to the upper package 200. The connections at the neighboring regions are described in more detail below.

A plurality of lower package connection pads 118 are arranged on the upper surface 112 and the lower surface 114 of the substrate 110. For example, some of the lower package connection pads 118 are arranged in the neighboring regions of the upper surface 112 of the substrate 110. The plurality of lower package connection pads 118 are arranged to correspond to a plurality of connection bumps 240 disposed on the upper package 200 (see FIG. 3), and connect the lower package 100 to the upper package 200.

The semiconductor chip 120 is attached to a chip region of the upper surface 112 of the substrate 110 by an adhesive (not shown) such as, for example, liquid epoxy or adhesive tape. A wire bonding method is used to electrically connect wires 124 to pads (not shown) arranged on the upper surface 112 of the substrate 110, and to the semiconductor chip 120. In this exemplary embodiment, one semiconductor chip 120 is included in the lower package 100. However, the present inventive concept is not limited thereto, and the lower package 100 may further include one or more additional semiconductor chips (not shown) vertically laminated on the semiconductor chip 120.

The encapsulant material 130 is formed on the upper surface 112 of the substrate 110 and covers and seals the semiconductor chip 120 and the wires 124. For example, the encapsulant material 130 may be substantially formed on the chip region or a portion of the chip region of the upper surface 112 of the substrate 110, but may not be formed on the neighboring regions. As a result, the lower package connection pads 118 arranged in the neighboring regions are exposed and can make contact with the connection bumps 240 (see FIG. 3). The encapsulant material 130 may be made of, for example, thermosetting resin including, but not limited to, epoxy mold compound (EMC).

The connection bumps 140 are disposed on the lower surface 114 of the substrate 110, and are electrically connected to the plurality of lower package connection pads 118 arranged on the lower surface 114 of the substrate 110 and to the semiconductor chip 120. The connection bumps 140 may further be electrically connected to a motherboard (not shown) arranged below the lower package 100, or another semiconductor package (not shown). In another exemplary embodiment, various types of conductors may be used in place of the connection bumps 140.

Referring to FIG. 2, an upper package 200 according to an exemplary embodiment of the present inventive concept includes a substrate 210, semiconductor chips 222 and 226, an encapsulant material 230, a plurality of connection bumps 240, and decoupling capacitors 250.

The plane area of the substrate 210 of the upper package 200 is larger than the plane area of the substrate 110 of the lower package 100. The substrate 210 includes an upper surface 212 and an opposing lower surface 214. The substrate may 210 may be, for example, a printed circuit board (PCB). A chip region and neighboring regions are defined on the lower surface 214 of the substrate 210, and correspond to the chip region and the neighboring regions defined on the upper surface 112 of the substrate 110 of the lower package 100. Accordingly, the semiconductor chip 120 of the lower package 100 is positioned below the chip region defined on the lower surface 214 of the substrate 210, and the neighboring regions defined on the lower surface 214 of the substrate 210 are used as connection regions to the lower package 100. Since the plane area of the substrate 210 of the upper package 200 is larger than the plane area of the substrate 110 of the lower package 100, additional regions exist on the lower surface 214 of the substrate 210. These additional regions are disposed adjacent to the neighboring regions, and are referred to hereinafter as outer regions. The outer regions extend beyond the periphery of the first substrate 100. Thus, the lower surface 214 of the substrate 210 of the upper package 200 includes the chip region, the neighboring regions, and the outer regions. The decoupling capacitors 250 are disposed in the outer regions of the lower surface 214 of the substrate 210. The decoupling capacitors 250 are described in more detail below.

A plurality of upper package connection pads 218 is disposed in the neighboring regions of the lower surface 214 of the substrate 210. The upper package connection pads 218 are arranged to correspond to the lower package connection pads 118 disposed on the upper surface 112 of the substrate 110 of the lower package 100, thus allowing for the connection bumps 240 to connect the upper package 200 and the lower package 100.

The outer regions of the lower surface 214 of the substrate 210 may further include electrode pads 219 which are directly connected to the decoupling capacitors 250. The electrode pads 219 are described in more detail below.

The lower semiconductor chip 222 and the upper semiconductor chip 226 are vertically laminated on the upper surface 212 of the substrate 210. For example, the lower semiconductor chip 222 is attached to the upper surface 212 of the substrate 210 using an adhesive, and is electrically connected to pads (not shown) disposed on the upper surface 212 of the substrate 210 by wires 224. The upper semiconductor chip 226 is attached to the upper surface of the lower semiconductor chip 222 using an adhesive, and is electrically connected to pads (not shown) disposed on the upper surface 212 of the substrate 210 by wires 228. In an exemplary embodiment of the present inventive concept, two semiconductor chips 222 and 226 are included in the upper package 200. However, the present inventive concept is not limited thereto, and the upper package 200 may also include one semiconductor chip, or three or more semiconductor chips vertically laminated on each other.

Since the plane area of the substrate 210 of the upper package 200 is larger than the plane area of the substrate 110 of the lower package 100, the thickness of the upper package 200 may be larger than that the thickness of the lower package 100. Accordingly, the number of laminated semiconductor chips included in the upper package 200 may be larger than the number of laminated semiconductor chips included in the lower package 100.

The encapsulant material 230 is formed on the upper surface 212 of the substrate 210 and covers and seals the semiconductor chips 222 and 226 and the wires 224 and 228. In an exemplary embodiment of the present inventive concept, the encapsulant material 230 may be substantially formed over the upper portion of the upper surface 212 of the substrate 210. However, the present inventive concept is not limited thereto, and the encapsulant material 230 may be formed on only a portion of the upper surface 212 of the substrate 210.

The connection bumps 240 are attached to the plurality of upper package connection pads 218 arranged in the neighboring regions of the lower surface 214 of the substrate 210, and are electrically connected to the semiconductor chips 222 and 226. In another exemplary embodiment, various types of conductors may be used in place of the connection bumps 240.

The decoupling capacitors 250 are directly connected to the electrode pads 219 disposed in the outer regions of the lower surface 214 of the substrate 210. Each of the decoupling capacitors 250 includes first and second electrodes 252a and 252b and an insulator 254 interposed between the electrodes 252a and 252b. The electrode pad 219 includes first and second electrode pads 219a and 219b to which different voltages are applied. The first and second electrodes 252a and 252b of the decoupling capacitor 250 may be connected to the first and second electrode pads 219a and 219b, respectively.

Referring to FIG. 3, the upper package 200 shown in FIG. 2 is laminated on the lower package 100 shown in FIG. 1 to form a package on package structure.

As described above and as shown in FIG. 3, because the plurality of lower package connection pads 118 arranged on the upper surface 112 of the substrate 110 of the lower package 100, the plurality of upper package connection pads 218 arranged on the lower surface 214 of the substrate 210 of the upper package 200, and the plurality of connection bumps 240 are aligned, the plurality of connection bumps 240 of the upper package 200 are directly connected to the lower package connection pads 118 and the upper package connection pads 218 to form the package on package structure.

As shown in FIG. 3, because the plane area of the substrate 210 of the upper package 200 is larger than the plane area of the substrate 110 of the lower package 100, the lower package 100 is disposed below the chip region and the neighboring regions of the lower surface 214 of the substrate 210 of the upper package 200, but is not disposed below the outer regions of the lower surface 214 of the substrate 210 of the upper package 200. Accordingly, the size of the decoupling capacitors 250, and the thickness t of the decoupling capacitors 250 can be sufficiently increased, thus increasing the capacitance of the decoupling capacitors 250.

The decoupling capacitors 250 may be electrically connected to the semiconductor chips 222 and 226 of the upper package 200 through a wire pattern (e.g., a printed circuit pattern) (not shown) disposed in the substrate 210 of the upper package 200. The decoupling capacitors 250 may further be electrically connected to the semiconductor chip 120 of the lower package 100 through the wire pattern disposed in the substrate 210 of the upper package 200, the upper package connection pads 218, the connection bumps 240, the lower package connection pads 118 of the upper surface 112 of the lower package 100, and a wire pattern (not shown) disposed in the substrate 110 of the lower package 100.

Referring to FIG. 4, four decoupling capacitors 250 are disposed in the outer regions of the lower surface 214 of the substrate 210 of the upper package 200. For example, in an exemplary embodiment where the substrate 210 is in the shape of a tetragon, the four decoupling capacitors 250 may be arranged on four sides of the substrate 210, respectively. However, the present inventive concept is not limited thereto, and the shape of the substrate 210, and the number and position of the decoupling capacitors 250, may be modified.

Figure 5:
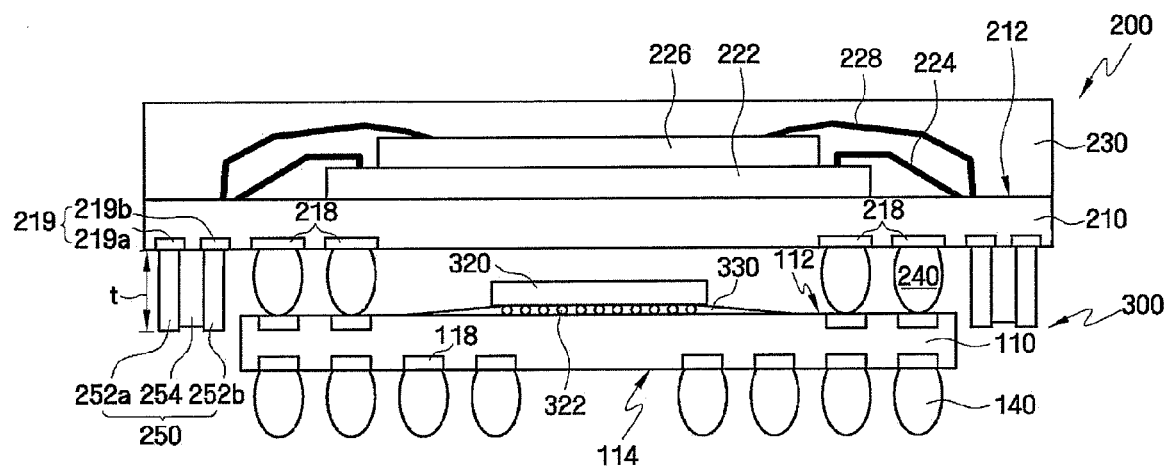
FIG. 5 is a sectional view of a package on package structure according to an exemplary embodiment of the present inventive concept.

Hereinafter, with reference to FIG. 5, a package on package structure according to an exemplary embodiment of the present inventive concept will be described. FIG. 5 is a sectional view of a package on package structure according to an exemplary embodiment.

Referring to FIG. 5, a package on package structure in which the upper package 200 is laminated on the lower package 300 according to an exemplary embodiment of the inventive concept is formed.

As shown in FIG. 5, the lower package 300 includes a substrate 110 having an upper surface 112 and a lower surface 114, a plurality of lower package connection pads 118 disposed on the upper surface 112 and the lower surface 114 of the substrate 110, and a plurality of connection bumps 140 attached to the lower package connection pads 118 of the lower surface 114 of the substrate 110. In addition, the lower package 300 further includes a semiconductor chip 320 and an encapsulant material 330.

A plurality of chip bumps 322 is formed on the semiconductor chip 320. The chip bumps 322 may be formed, for example, on an input/output (I/O) pad (not shown) of the semiconductor chip 320. The semiconductor chip 320 is attached to the upper surface 112 of the substrate 110 and is electrically connected to the substrate 110 via the chip bumps 322.

The encapsulant material 330 is formed to fill in a space between the semiconductor chip 320 and the substrate 110 so as to protect the chip bumps 320 and to increase the adhesive strength between the semiconductor chip 320 and the substrate 110.

Figure 6:
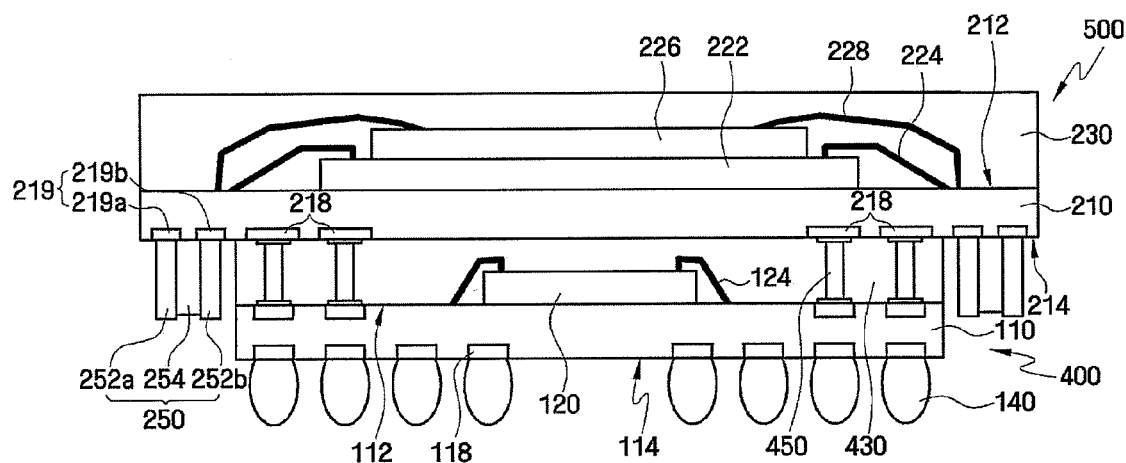
FIG. 6 is a sectional view of a package on package structure according to an exemplary embodiment of the present inventive concept.

Hereinafter, with reference to FIG. 6, a package on package structure according an exemplary embodiment of the present inventive concept will be described. FIG. 6 is a sectional view of a package on package structure according to an exemplary embodiment.

Referring to FIG. 6, a lower package 400 according to an exemplary embodiment of the present inventive concept includes a substrate 110 having an upper surface 112 and a lower surface 114, a plurality of lower package connection pads 118 arranged on the upper surface 112 and the lower surface 114 of the substrate 110, a semiconductor chip 120 attached to the upper surface 112 of the substrate 110 and electrically connected to the substrate 110 by wires 124, and a plurality of connection bumps 140 attached to the lower package connection pads 118 of the lower surface 114 of the substrate 110. In addition, the lower package 400 further includes an encapsulant material 430 and electrical connection members 450 penetrating the encapsulant material 430.

The encapsulant material 430 is formed on the upper surface 112 of the substrate 110 and covers and seals the semiconductor chip 120 and the wires 124. For example, the encapsulant material 430 may be substantially formed on the upper surface 112 of the substrate 110 except for regions of the substrate 110 where the electrical connection members 450 are formed.

The electrical connection members 450 are disposed in and penetrate the encapsulant material 430. Lower ends of the electrical connection members 450 connect to the lower package connection pads 118 disposed on the upper surface 112 of the substrate 110 of the lower package 400, and upper ends of the electrical connection members 450 connect to upper package connection pads 218 disposed on the lower surface 214 of the substrate 210 of the upper package 500. The electrical connection members 450 may include various conductive materials.

The encapsulant material 430 and the electrical connection members 450 may be formed in the following manner. The encapsulant material 430 may first be formed on the upper surface 112 of the substrate 110 of the lower package 400, contact holes (not shown) for exposing the lower package connection pads 118 disposed on the upper surface 112 of the substrate 110 of the lower package 400 may then be formed in the encapsulant material 430, and a conductive material may then be used to fill the contact holes. Alternatively, the electrical connection members 450 may first be formed on the lower package connection pads 118 disposed on the upper surface 112 of the substrate 110 of the lower package 400, the encapsulant material 430 may then be substantially formed on an upper portion of the substrate 110 of the lower package 400, and a planarization process or the like may then be performed to expose the upper ends of the electrical connection members 450.

According to an exemplary embodiment of the present inventive concept, the upper package connection pads 218 are directly connected to the upper ends of the electrical connection members 450 of the lower package 400 rather than through connection bumps 240. As a result, the upper package 500 can be laminated on the upper portion of the lower package 400.

Figure 7:
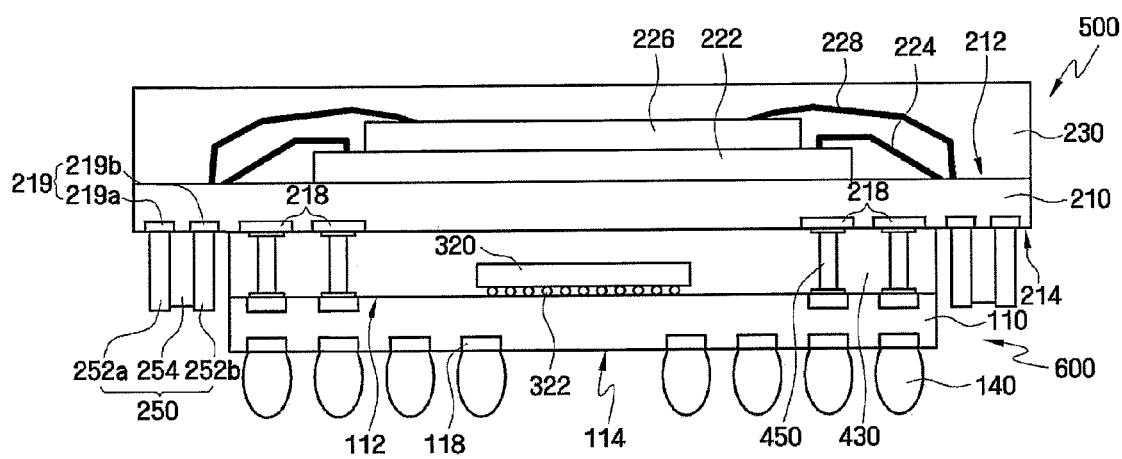
FIG. 7 is a sectional view of a package on package structure according to an exemplary embodiment of the present inventive concept.

Hereinafter, with reference to FIG. 7, a package on package structure according to an exemplary embodiment of the present inventive concept will be described. FIG. 7 is a sectional view of a package on package structure according to an exemplary embodiment.

Referring to FIG. 7, a package on package structure in which the upper package 500 is laminated on the lower package 600 according to an exemplary embodiment of the present inventive concept is formed.

In this exemplary embodiment, the lower package 600 includes a substrate 110 having an upper surface 112 and a lower surface 114, a plurality of lower package connection pads 118 arranged on the upper surface 112 and the lower surface 114 of the substrate 110, and a plurality of connection bumps 140 attached to the lower package connection pads 118 of the lower surface 114 of the substrate 110.

In addition the semiconductor chip 320 is electrically connected to the substrate 110 by a plurality of chip bumps 322.

The encapsulant material 430 is formed on the upper surface 112 of the substrate 110 and covers and seals the semiconductor chip 320. For example, the encapsulant material 430 may be substantially formed on a region of the upper surface 112 of the substrate 110 except for regions of the substrate 110 where the electrical connection members 450 are formed.

The electrical connection members 450 are disposed in and penetrate the encapsulant material 430. Lower ends of the electrical connection members 450 connect to the lower package connection pads 118 disposed on the upper surface 112 of the substrate 110 of the lower package 600, and upper ends of the electrical connection members 450 connect to upper package connection pads 218 disposed on the lower surface 214 of the substrate 210 of the upper package 500. The electrical connection members 450 may include various conductive materials.

In the exemplary embodiments described above, the substrate of the upper package has a plane area that is larger than the plane area of the substrate of the lower package. As a result, the size and thickness of decoupling capacitors formed on the lower surface of the upper package may be increased. Accordingly, the capacitance of the decoupling capacitors may be increased, and thus, the voltage flicker and voltage drop phenomenon may be prevented.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A package on package structure, comprising:
    a lower package, comprising a first semiconductor chip disposed in a chip region of an upper surface of a first substrate; and
    an upper package, comprising a second semiconductor chip disposed on an upper surface of a second substrate, and a decoupling capacitor disposed in an outer region of a lower surface of the second substrate,
    wherein the lower surface of the second substrate opposes the upper surface of the second substrate and faces the upper surface of the first substrate, a plane area of the second substrate is larger than a plane area of the first substrate, and the outer region of the lower surface of the second substrate extends beyond a periphery of the first substrate.

2. The package on package structure of claim 1, wherein the second substrate further comprises an electrode pad disposed in the outer region of the lower surface, and the decoupling capacitor is electrically connected to the electrode pad.

3. The package on package structure of claim 2, wherein the decoupling capacitor comprises a first electrode and a second electrode facing each other, and an insulator disposed between the first and second electrodes, and the electrode pad comprises a first electrode pad connected to the first electrode and a second electrode pad connected to the second electrode.

4. The package on package structure of claim 1, wherein the decoupling capacitor is electrically connected to at least one of the first semiconductor chip or the second semiconductor chip.

5. The package on package structure of claim 1, further comprising at least one additional semiconductor chip vertically laminated to at least one of the first semiconductor chip or the second semiconductor chip.

6. The package on package structure of claim 5, wherein a number of semiconductor chips included in the upper package is larger than a number of semiconductor chips included in the lower package.

7. The package on package structure of claim 1, wherein the first semiconductor chip is attached to the upper surface of the first substrate with an adhesive, and is electrically connected to the second substrate using wire bonding.

8. The package on package structure of claim 7, wherein the adhesive comprises one of a liquid epoxy or an adhesive tape.

9. The package on package structure of claim 1, wherein the second semiconductor chip is attached to the upper surface of the second substrate with an adhesive, and is electrically connected to the second substrate using wire bonding.

10. The package on package structure of claim 9, wherein the adhesive comprises one of a liquid epoxy or an adhesive tape.

11. The package on package structure of claim 1, wherein the first semiconductor chip comprises a plurality of chip bumps formed on a lower surface of the first semiconductor chip, and the first semiconductor chip is electrically connected to the first substrate by the plurality chip bumps.

12. The package on package structure of claim 1, wherein the second semiconductor chip comprises a plurality of chip bumps formed on a lower surface of the second semiconductor chip, and the second semiconductor chip is electrically connected to the second substrate by the plurality of chip bumps.

13. The package on package structure of claim 1, further comprising:
  a plurality of lower package connection pads which are disposed in a neighboring region of the upper surface of the first substrate, wherein the neighboring region is between the chip region and the outer region;
  a plurality of upper package connection pads disposed on the lower surface of the second substrate and substantially aligned with the lower package connection pads; and
  a plurality of conductors disposed between the first package and the second package in the neighboring region, and electrically connecting the lower package connection pads and the upper package connection pads.

14. The package on package structure of claim 13, further comprising:
  a first wire pattern disposed in the second substrate of the upper package, at least one of the plurality of upper package connection pads, and at least one of the plurality of conductors; and
  a second wire pattern disposed in the first substrate of the lower package,
  wherein the decoupling capacitor and the first semiconductor chip are electrically connected via the first and second wire patterns.

15. The package on package structure of claim 1, further comprising a wire pattern disposed in the second substrate, wherein the decoupling capacitor and the second semiconductor chip are electrically connected via the wire pattern.

16. The package on package structure of claim 1, further comprising an encapsulant material disposed on the upper surface of the first substrate, wherein the encapsulant material covers the first semiconductor chip.

17. The package on package structure of claim 16, wherein the encapsulant material comprises a thermosetting resin.

18. The package on package structure of claim 1, wherein a thickness of the upper package is larger than a thickness of the lower package.

19. A package on package structure, comprising:
  a lower package, comprising a first semiconductor chip disposed in a chip region of an upper surface of a first substrate, and a plurality of lower package connection pads disposed in a neighboring region of the upper surface of the first substrate; and
  an upper package, comprising a second semiconductor chip disposed on an upper surface of a second substrate, a plurality of upper package connection pads disposed on a lower surface of the second substrate and substantially aligned with the lower package connection pads, and a decoupling capacitor disposed in an outer region of the lower surface of the second substrate, wherein the outer region extends beyond a periphery of the first substrate, and the neighboring region is between the chip region and the outer region,
  wherein the lower surface of the second substrate opposes the upper surface of the second substrate and faces the upper surface of the first substrate, and connection bumps disposed in the neighboring region electrically connect the lower package connection pads and the upper package connection pads.

20. A package on package structure, comprising:
  a lower package, comprising a first semiconductor chip disposed in a chip region of an upper surface of a first substrate, a plurality of lower package connection pads disposed in a neighboring region of the upper surface of the first substrate, wherein an encapsulant material disposed on the upper surface of the first substrate; and
  an upper package, comprising a second semiconductor chip disposed on an upper surface of a second substrate, a plurality of upper package connection pads disposed on a lower surface of the second substrate and substantially aligned with the lower package connection pads, and a decoupling capacitor disposed in an outer region of the lower surface of the second substrate, wherein the outer region extends beyond a periphery of the first substrate, and the neighboring region is between the chip region and the outer region,
  wherein the lower surface of the second substrate opposes the upper surface of the second substrate and faces the upper surface of the first substrate, and electrical connection members disposed in the neighboring region penetrate the encapsulant material and electrically connect the lower package connection pads and the upper package connection pads.

* * * * *